United States Patent
Walsh et al.

(12) 
(10) Patent No.: US 6,228,741 B1
(45) Date of Patent: May 8, 2001

(54) METHOD FOR TRENCH ISOLATION OF SEMICONDUCTOR DEVICES

(75) Inventors: Shawn T. Walsh, Richardson; John E. Campbell, Plano; James B. Friedmann, Dallas, all of TX (US); Thomas M. Parrill, North Andover, MA (US); Der'E Jan, Plano, TX (US); Joshua J. Robbins, Dallas, TX (US); Byron T. Ahlburn, Plano, TX (US); Sue Ellen Crank, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/228,583

(22) Filed: Jan. 11, 1999

Related U.S. Application Data

(60) Provisional application No. 60/071,042, filed on Jan. 13, 1998.

(51) Int. Cl.[7] ................................................. H01L 21/76
(52) U.S. Cl. .......................... 438/400; 438/424; 438/431
(58) Field of Search ................................. 438/400, 424, 438/427, 431, 435, 296, 437

(56) References Cited

U.S. PATENT DOCUMENTS

| 5,721,173 |   | 2/1998 | Yano et al. | 438/424 |
| 5,786,263 | * | 7/1998 | Perera | 438/431 |
| 5,976,947 | * | 11/1999 | Reinberg | 438/424 |
| 5,976,951 | * | 11/1999 | Huang et al. | 438/435 |
| 6,074,927 | * | 6/2000 | Kepler et al. | 438/400 |

FOREIGN PATENT DOCUMENTS

| 0 424 905 A2 | 10/1990 | (EP) | H01L/21/76 |
| 0 813 240 A1 | 6/1997 | (EP) | H01L/21/762 |
| 60-53045 | 9/1983 | (JP) | H01L/21/76 |
| 60-64445 | 9/1983 | (JP) | H01L/21/76 |

OTHER PUBLICATIONS

Author unknown. IBM Corp. "Selective planarization process and structures". IBM Technical Disclosure Bulletin, Sep. 1984, US. vol. 27, No. 4b, pp. 2560–2563, XP–002110920.

\* cited by examiner

*Primary Examiner*—David Nelms
*Assistant Examiner*—Phuc T. Dang
(74) *Attorney, Agent, or Firm*—David Denker; Wade James Brady, III; Frederick J. Telecky, Jr.

(57) ABSTRACT

A method is given for removing excess oxide from active areas after shallow trench isolation, without the use of chemical-mechanical polishing. A nitride mask protects active areas during the etch of isolation trenches. The trenches are filled with oxide, using high density plasma deposition, which simultaneously etches, providing a sloping contour around the isolation trenches. A further layer of nitride is used to provide a cap over the trench which seals to the underlying layer of nitride. The cap layer of nitride receives a patterned etch to remove the cap only over the active areas. This allows a selective etch to remove the excess oxide, which can be followed by a selective etch to remove the nitride layers.

18 Claims, 4 Drawing Sheets

METHOD FOR TRENCH ISOLATION OF SEMICONDUCTOR DEVICES

This application claims priority under 35 USC § 119(e)(1) of provisional application number 60/071,042 filed Jan. 13, 1998.

BACKGROUND AND SUMMARY OF THE INVENTION

The present invention relates to integrated circuit structures and fabrication methods, and especially to producing a planar surface after shallow trench isolation without chemical-mechanical polishing.

Background: Shallow Trench Isolation and Chemical Mechanical Polishing

Shallow Trench Isolation (STI) proceeds by etching a trench in the silicon wafer and backfilling the trench with a suitable insulator material. Since the backfill process deposits the insulator on the active areas as well as in the trench, the excess insulator material must be removed in a manner that results in a flat surface that is level with the active area surface.

Current STI methods use chemical mechanical polishing (CMP) to remove the excess insulator material and level it to the active area surface. The CMP process suffers from non-uniformities arising from varying polish rates across the wafer and across the die (due to differences in circuitry density).

Current STI methods attempt to compensate for the CMP non-uniformities by adding extra, non-functional moat to wide field oxide areas. This is only partly successful, because there are some areas that cannot maintain proper circuit operation in the presence of additional moat. Other compensation methods add trench etch patterns to the edge of the wafer to attempt to reduce the wafer level non-uniformity.

Innovative Structures and Methods

It is herein disclosed that the CMP process can be eliminated after shallow trench formation by a careful sequence of deposition and etch, both of which are more uniform processes than CMP. The trench is patterned and etched according to known methods, using a nitride mask. The trench is then filled using a process which simultaneously deposits and etches, such as high density plasma (HDP), producing planar surfaces over the trench and active areas and a sloped surface between the two planes. The edge of the nitride is not covered during the deposition and a short etch of the oxide further exposes the nitride corner without appreciably removing any oxide. A cap nitride is then deposited over the entire surface and, together with the original nitride mask, will seal the trench from contact with the surface. The cap nitride is patterned, using any of various methods, including, but not limited to, photolithography, polymer spin-on and etchback, and oxide spin-on and etchback, to expose the cap nitride over the active areas only. The cap nitride is etched, selective to the oxide, to leave the cap only over the trenches. This exposes the oxide over the active area, which may be removed with an etch which is selective to the nitride. Once the oxide is removed, both the cap nitride and the original mask nitride are removed, leaving planar active area surfaces and only a small thickness of trench oxide above the surface. Processing then proceeds with known methods.

Advantages of the disclosed methods and structures include:

produces a uniform surface across die and wafer;
eliminates need for non-functional moat;
eliminates need for extra trench etch patterns;
uses standard processes;
eliminates need for chemical-mechanical polishing (CMP); and
reduces cost of fabrication.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

PRESENTLY PREFERRED EMBODIMENT

Figure 1:
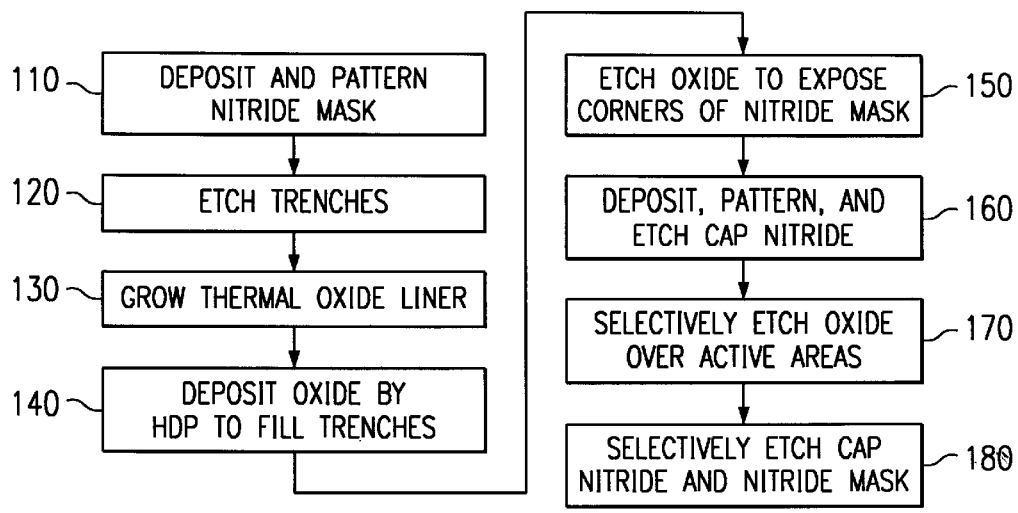
FIG. 1 shows a flowchart of the disclosed process.

A flowchart of the disclosed method is shown in FIG. 1, which will now be discussed in conjunction with FIGS. 2–9, which show cross-sections of the wafer at various points in the flow.

Figure 2:
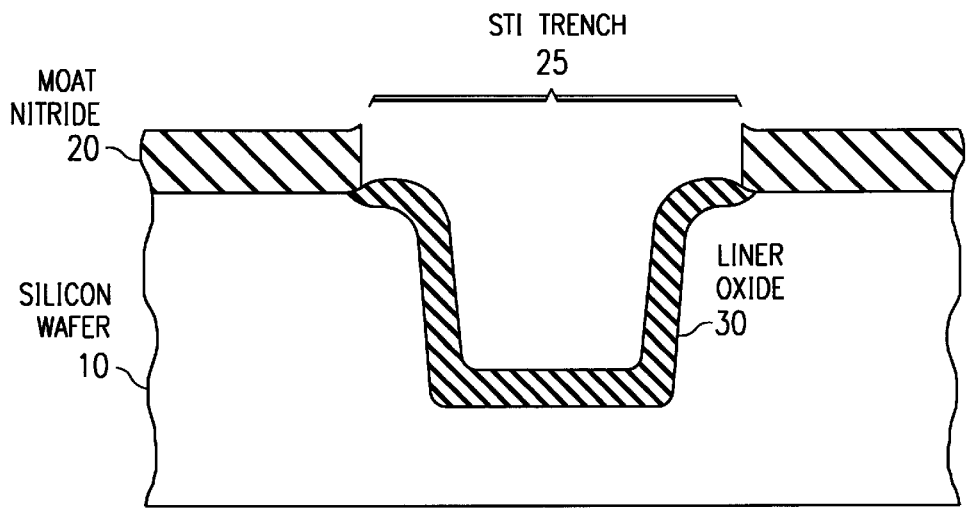
FIGS. 2–9 show a cross-section of the wafer at various steps in the disclosed process.

In preparation for etching isolation trenches into a silicon wafer 10, a layer of nitride 20 is deposited and patterned (step 110) according to a known process, so that the nitride covers the designed active areas, but exposes the trench areas. The trenches 25 are then etched (step 120) and a thin oxide liner 30 is typically grown (step 130), to form a structure as shown in FIG. 2.

In one embodiment of the disclosed process, the trench is then filled (step 140) with an oxide 40, such as silicon dioxide, which is deposited by a high density plasma (HDP) process as follows:

| | |
|---|---|
| O2 flow | 150–300 sccm |
| SiH4 flow | 100–200 sccm |
| He flow | 300–500 sccm |
| Plasma excitation power | 3500–4500 watt |
| Bias power | 1500–2500 watt |
| Wafer not clamped by electrostatic chuck | |

The exact values for these parameters will depend on the maximum aspect ratio of the trenches to be filled, as will the time for film deposition.

Figure 3:
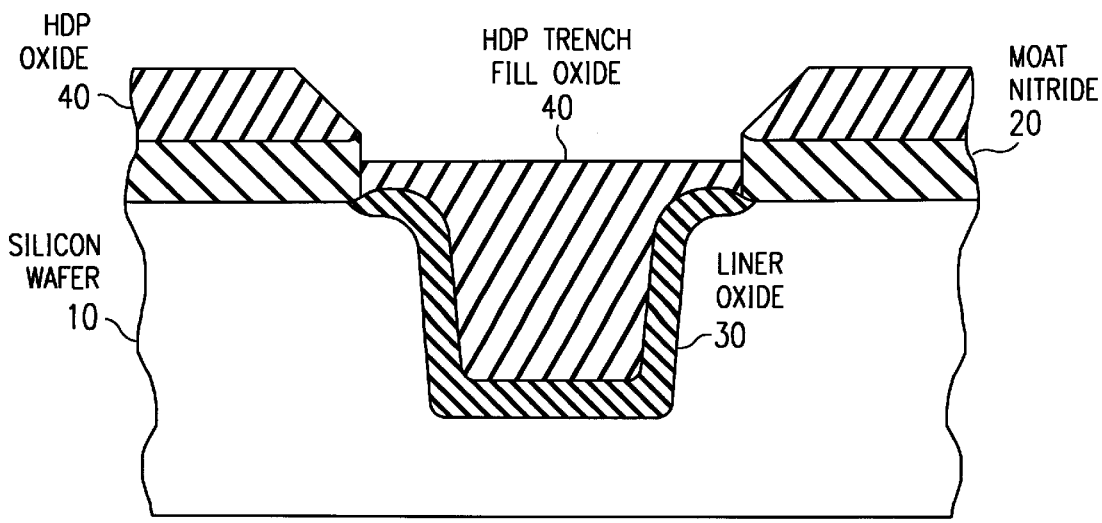
Figure 4:
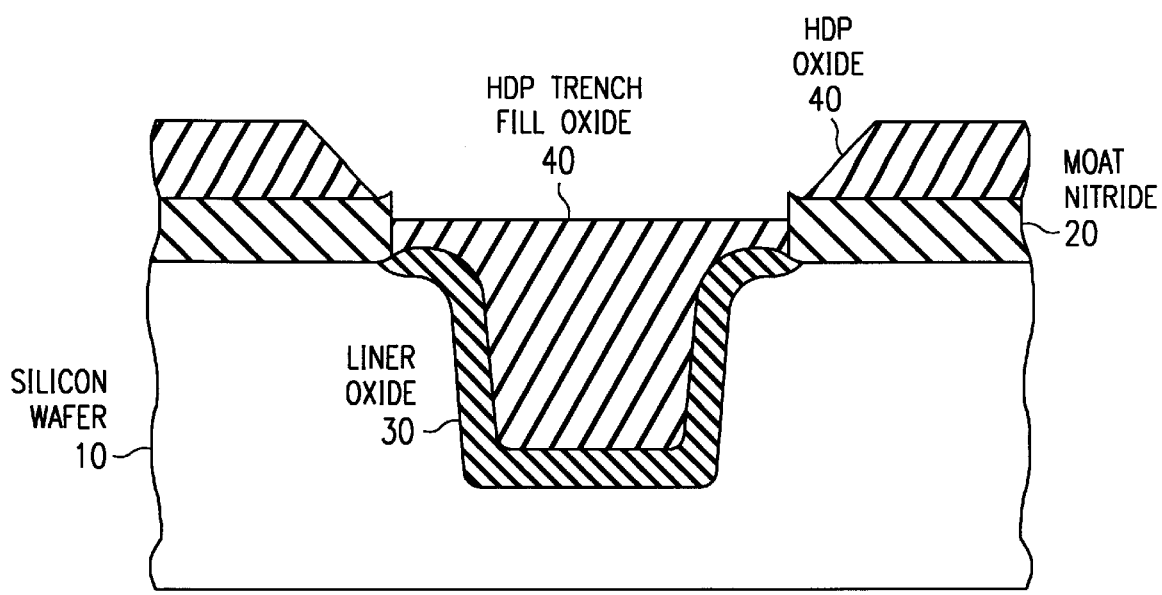

Because the HDP process simultaneously deposits and etches, it tends to form planar surfaces with sloping edges, as seen in FIG. 3. It is anticipated that the HDP process will need to be carefully controlled to deposit the oxide to approximately the level of the nitride mask, but to leave the edges of the nitride mask near the trenches uncovered. An in situ sputter etch (step 150) is then performed by turning off the SiH$_4$ flow and introducing 200–400 sccm of Ar gas for a few seconds. This should guarantee that the edges of the nitride 30 will be exposed, as seen in FIG. 4, since the etch of the sloped sidewalls will be faster than at the horizontal surfaces. This etch removes only a minimal thickness of deposited oxide and does not affect the planarity of the oxide in the trench.

Figure 5:
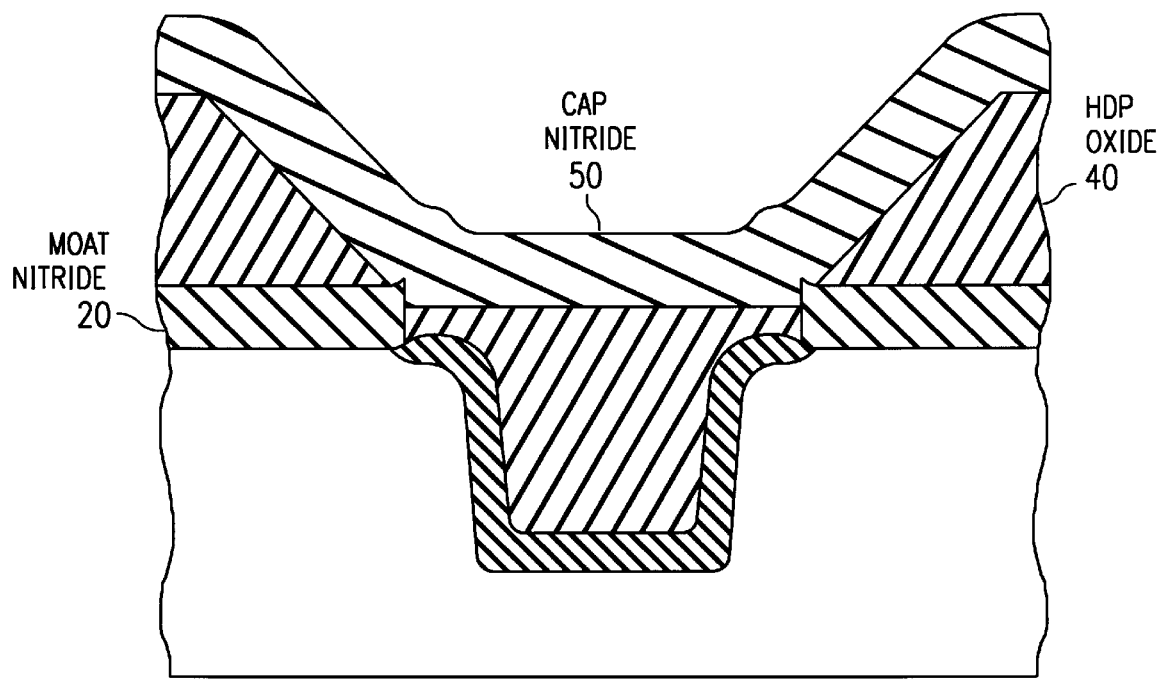
Figure 6:
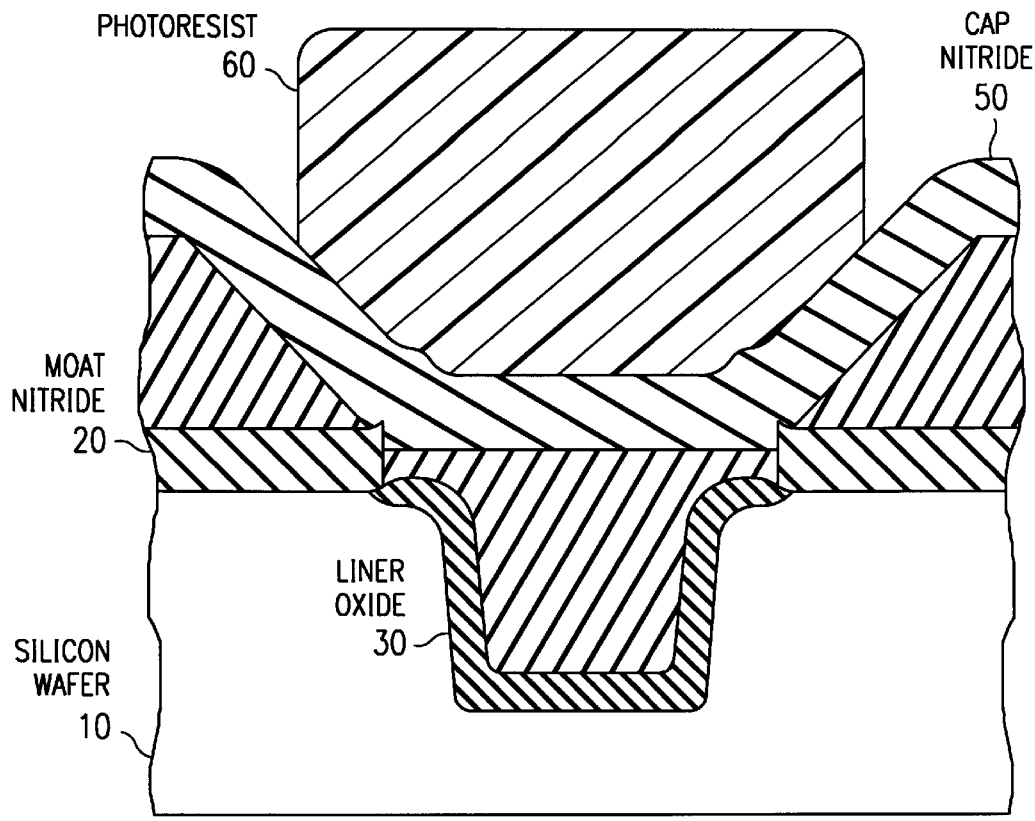
Figure 7:
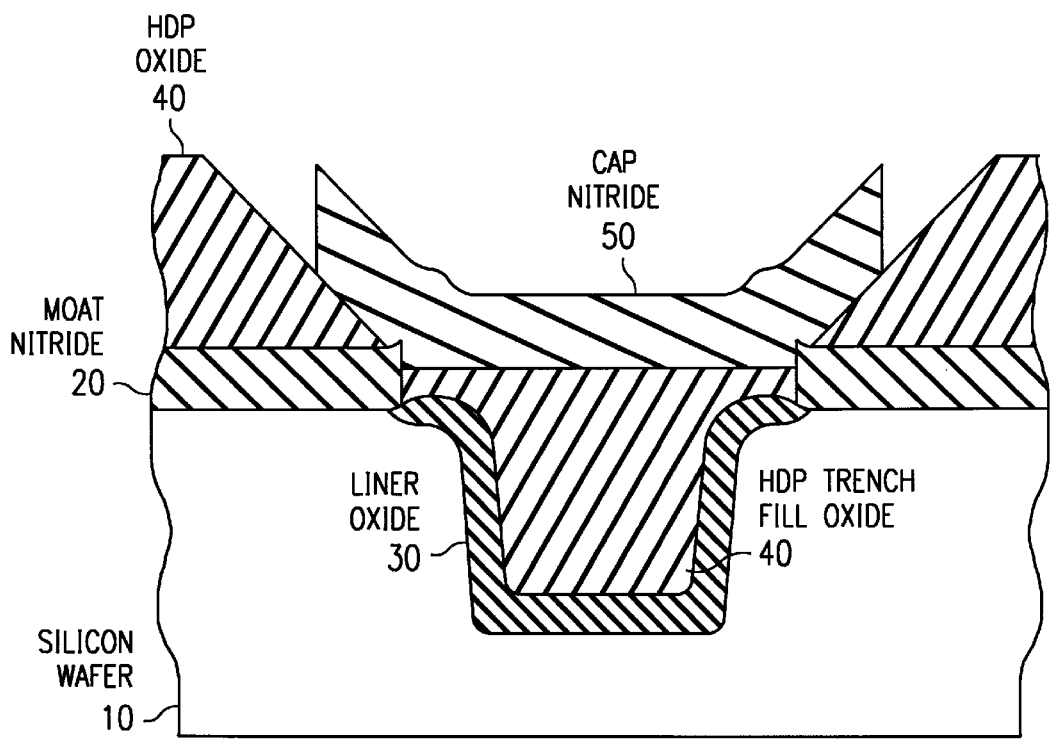

A conformal nitride cap layer 50 is then deposited on the wafer, contacting the mask nitride along its top corner edges, as shown in FIG. 5. The cap nitride 50 is then patterned and etched (step 160), using any of various methods, including, but not limited to, photolithography, polymer spin-on and etchback, or oxide spin-on and etchback, combined with an anisotropic etch, to remove the nitride over the active areas. This etch is chosen to be highly selective to the underlying oxide, and in this preferred embodiment is H3PO4. The remaining portion of the cap nitride 50 with the original mask nitride 20, completely covers the oxide in the trench. FIG. 6 shows a patterned photoresist in place over the cap nitride, while FIG. 7 shows the nitride removed over the active areas.

Figure 8:
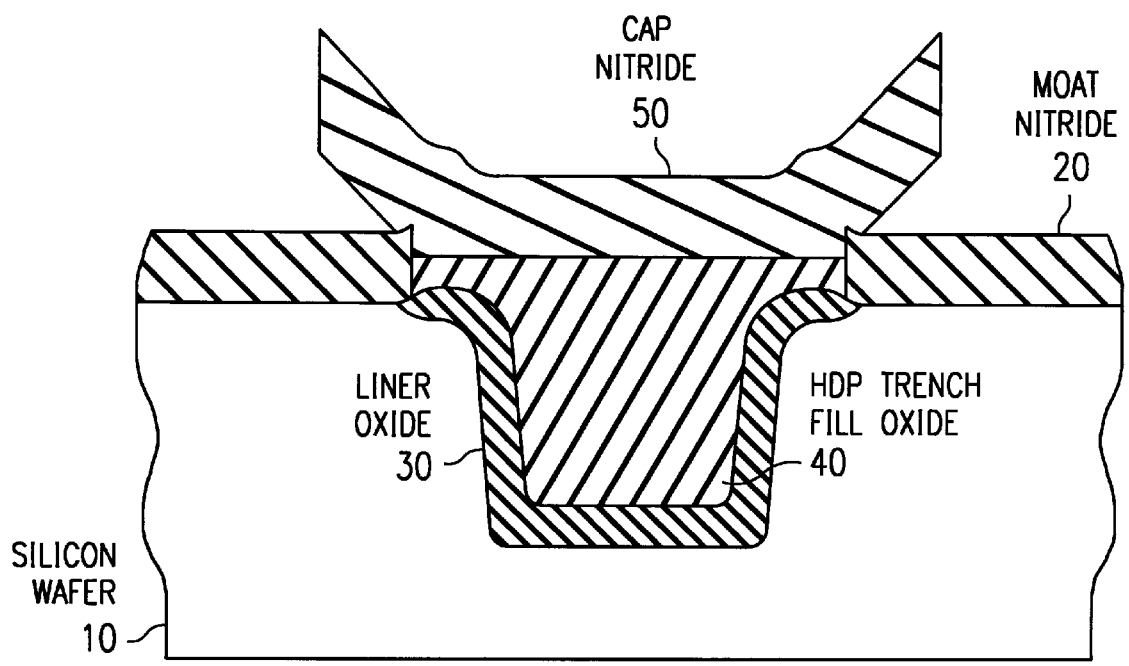
Figure 9:
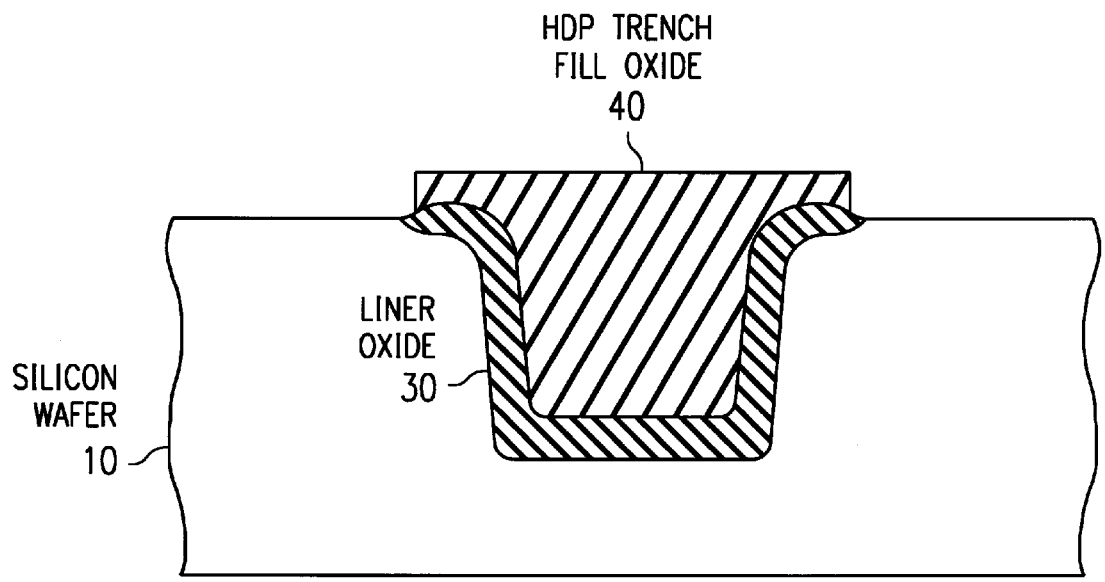

Once the etch of the nitride is completed, the exposed oxide is etched (step 170) to completely remove it over the active areas, as seen in FIG. 8. This etch is chosen to be highly selective to the underlying nitride, and in this embodiment is dilute HF. Finally, once the oxide is removed, the remaining nitride can be removed, giving the structure seen in FIG. 9.

First Alternate Embodiment

Although the primary embodiment has been described in terms of bulk silicon, the process can also be used in silicon-on-insulator (SOI) technologies.

Second Alternate Embodiment

The primary embodiment has been described in terms of a nitride mask, but other materials can also be used, e.g. silicon oxynitride.

According to a disclosed class of innovative embodiments, there is provided: A method for making trench isolation, comprising the steps of: (a.) forming a first layer of a first dielectric material which overlies a semiconductor material and trenches in said semiconductor material, said first layer and said trenches being in a self-aligned relationship; (b.) filling said trenches with a second dielectric material, in a manner such that a portion of said first layer near the edges of said trenches is exposed; (c.) depositing a second layer of said first dielectric over said second dielectric layer, such that said second layer of said first dielectric contacts said exposed portion of said first layer of said first dielectric; (d.) removing portions of said second layer of said first dielectric which do not overlie said trenches and selectively removing portions of said second dielectric which overlies areas where said trenches are not present; and (e.) removing said first dielectric, using an etch which is selective to said second dielectric; whereby said trenches are left substantially filled with said second dielectric.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

In an alternate embodiment, hydrogen-silsequioxane (HSQ) can be spun on instead of photoresist. In this embodiment, the conditions of the spin coating and thermal processing of the HSQ are carefully controlled to position the HSQ oxide-like material only in the lowest areas of the nitride covered surface, thus making the photoresist patterning step unnecessary.

In a further alternate embodiment, the short etch (step 150) after oxide deposition can be a wet etch with, for example, dilute HF.

What is claimed is:

1. A method for making trench isolation, comprising the steps of:
    (a.) forming a first layer which overlies a semiconductor material and trenches in said semiconductor material, said first layer and said trenches being in a self-aligned relationship, wherein said first layer comprises a first dielectric material;
    (b.) filling said trenches with a second dielectric material, in a manner such that a portion of said first layer near the edges of said trenches is exposed;
    (c.) depositing a second layer—the second layer comprising said first dielectric material—over said second dielectric material, such that said second layer contacts said exposed portion of said first layer;
    (d.) removing portions of said second layer which do not overlie said trenches and selectively removing portions of said second dielectric material which overlies areas where said trenches are not present; and
    (e.) removing said first dielectric material, using an etch which is selective to said second dielectric material;
    whereby said trenches are left substantially filled with said second dielectric material.

2. The method of claim 1, further comprising, before said step of filling said trenches, the step of lining said trenches with said second dielectric material.

3. The method of claim 2, wherein said second dielectric material is silicon dioxide, and said step of lining said trenches comprises an oxidation step.

4. The method of claim 1, wherein said first dielectric material comprises silicon nitride and wherein said etch which is selective to said second dielectric material is H3PO4.

5. A method for forming a filled trench in a semiconductor substrate, the method comprising
    providing a semiconductor substrate having a first surface with a trench, a portion of the first surface proximate the trench covered with a first layer, the first layer comprising a first dielectric material, and the first layer having an opening above the trench;
    filling the trench with a second dielectric material, the filling leaving a portion of the first layer that is proximate the trench exposed;
    depositing a second layer upon the second dielectric material, the second layer contacting the exposed portions of the first layer, and the second layer comprising the first dielectric material;
    defining a central portion and a peripheral portion of the second layer, wherein the central portion approximately covers the trench and the peripheral portion does not include the central portion;
    removing the peripheral portion of the second layer;
    selectively removing exposed portions of the second dielectric material while leaving the first dielectric material substantially intact; and
    selectively removing the first dielectric material while leaving the second dielectric material substantially intact.

6. The method of claim 5, wherein the trench and the opening above the trench are self aligned.

7. The method of claim 5, wherein defining a central portion comprises masking the central portion.

8. The method of claim 5, wherein the first dielectric material is a nitride.

9. The method of claim 5, wherein the second dielectric material is silicon dioxide.

10. The method of claim 5, wherein filling the trench comprises depositing silicon dioxide using a high-density plasma process.

11. The method of claim 10, wherein filling the trench further comprises a short etchback.

12. The method of claim 11, wherein the short etchback is an in situ sputter etch.

13. The method of claim 5, further comprising lining the walls of the trench with the second dielectric material before filling the trench.

14. The method of claim 13, wherein lining the walls comprises oxidizing the trench wall.

15. A method for forming a filled trench in a semiconductor substrate, the method comprising providing a semiconductor substrate having a first surface with a trench, a portion of the first surface proximate the trench covered with a first nitride layer, the first nitride layer having an opening above the trench;

filling the trench with silicon dioxide, the filling leaving a portion of the first nitride layer that is proximate the trench exposed;

depositing a second nitride layer upon the silicon dioxide, the second nitride layer contacting the exposed portions of the first nitride layer;

defining a central portion and a peripheral portion of the second nitride layer, wherein the central portion approximately covers the trench and the peripheral portion does not include the central portion;

removing the peripheral portion of the second nitride layer by etching;

selectively removing exposed portions of the silicon dioxide while leaving the nitride substantially intact; and selectively removing the nitride while leaving the silicon dioxide substantially intact.

16. The method of claim 15, further comprising oxidizing the trench wall before filling the trench.

17. The method of claim 15, wherein filling the trench comprises depositing silicon dioxide using a high-density plasma process, wherein the depositing occurs within the trench and upon the first nitride layer.

18. The method of claim 15, wherein filling the trench comprises depositing silicon dioxide using a high-density plasma process, followed by a short etchback; wherein the depositing occurs within the trench and upon the first nitride layer.

* * * * *